United States Patent [19]

Steele

[11] Patent Number: 4,983,857

[45] Date of Patent: Jan. 8, 1991

[54] POWER-UP RESET CIRCUIT

[75] Inventor: Randy C. Steele, Southlake, Tex.

[73] Assignee: SGS-Thomson Microelectronics, Inc., Carrollton, Tex.

[21] Appl. No.: 387,848

[22] Filed: Jul. 31, 1989

[51] Int. Cl.⁵ .................... H03K 5/153; H03K 17/20; H03K 17/22; H03K 17/687

[52] U.S. Cl. .................... 307/272.3; 307/594; 307/597; 307/603; 307/362

[58] Field of Search ............ 307/272.3, 592, 594, 307/597, 279, 296.4, 296.5, 603, 362

[56] References Cited

U.S. PATENT DOCUMENTS

| | | | |
|---|---|---|---|
| 4,405,871 | 9/1983 | Buurma et al. | 307/594 |
| 4,409,501 | 10/1983 | Eickerman et al. | 307/594 |
| 4,633,107 | 12/1986 | Norsworthy | 307/592 X |
| 4,634,905 | 1/1987 | Campbell, Jr. | 307/594 |
| 4,717,840 | 1/1988 | Ouyang et al. | 307/592 X |
| 4,746,822 | 5/1988 | Mahoney | 307/594 |

Primary Examiner—Stanley D. Miller
Assistant Examiner—David R. Bertelson
Attorney, Agent, or Firm—Kenneth C. Hill; Richard K. Robinson

[57] ABSTRACT

A circuit for generating a reset signal on chip power-up includes two field effect devices connected between a power supply voltage and the input to an inverter. A capacitor is connected between the inverter input and the low supply voltage. Current flows through the field effect devices to charge the transistor only when the supply voltages are greater than the sum of the absolute values of their threshold voltages. The output of the inverter is used as the chip power-up reset signal.

6 Claims, 1 Drawing Sheet

POWER-UP RESET CIRCUIT

BACKGROUND OF THE INVENTION

1. Field of the Invention:

The present invention relates generally to semiconductor integrated circuits, and more specifically to a circuit for generating a signal indicative of the initial application of power to an integrated circuit.

2. Description of the Prior Art:

For many integrated circuits, it is important that the circuitry on the chip power-up in a known state. This is true of sequential circuitry such as programmable logic devices having registers, microprocessors, and controllers. Failure to power up in a predictable state can cause such an integrated circuit to fail to function.

One technique for ensuring that an integrated circuit chip powers up in a known state is to provide a circuit on the chip which senses the initial application of power to the chip, and generates a reset signal which is applied to all registers on the chip. Such circuits are typically referred to as power-up reset circuits. The circuitry must ensure that the reset signal is applied after the supply voltage is high enough to ensure that all on chip logic is operating in a stable manner. The reset signal can be applied after the supply voltage has risen to a predetermined, minimum level, or it may be applied earlier and held until after the supply voltage has risen high enough to ensure stable circuit operation on the chip.

CMOS circuits become stable when the supply voltage is greater than the sum of the absolute values of the threshold voltages of the P-channel and N-channel devices. Thus, the power-up reset signal must be held until $V_{cc} > |V_{TN}| + |V_{TP}|$. The power-up reset circuitry must ensure that the reset signal is delayed until all parts of the chip have reached a stable operating voltage.

A typical power-up reset circuit used in the prior art is shown in FIG. 1. In such a circuit 10, a resistor 12 is connected to the positive voltage supply $V_{cc}$ and a capacitor 14. As is known in the art, a CMOS capacitor is easily fabricated using the gate oxide layer as the capacitor dielectric, with the source and drain grounded. The other side of the capacitor 14 is connected to ground.

A common node 16 between the resistor 12 and capacitor 14 is connected to the input of an inverter 18. The inverter 18 comprises a P-channel transistor 20 and an N-channel transistor 22 in the standard configuration. Output node 24 of the inverter 18 generates the signal PUPRST, which is the power-up reset signal for the remainder of the circuitry on the integrated circuit chip.

Upon power-up, once $V_{cc}$ rises above $|V_{TP}|$, the signal PUPRST tracks $V_{cc}$. Thus, PUPRST rises as $V_{cc}$ rises. This logical high signal causes an asynchronous reset on all of the registers on the chip. Individual flip flops containing chip state information are also preferably reset by this signal.

As $V_{cc}$ rises, current through the resistor 12 charges the capacitor 14 and raises the voltage at node 16. As the voltage on node 16 rises to a logic high level, the action of the inverter 18 causes the voltage at node 24 to go low. The signal PUPRST will remain low for as long as power is supplied to the chip.

The values for the resistor 12 and capacitor 14 are chosen so that the resulting RC time constant is greater than the specified minimum rise time for $V_{cc}$. The sizes of transistors 20 and 22 are chosen so that the combination of the trip point of the inverter 18 and the RC time constant allow PUPRST to be asserted for a sufficient time after $V_{cc}$ rises above $|V_{TN}| + |V_{TP}|$.

The length of time for which the signal PUPRST is asserted is therefore dependent upon process variations which occur during fabrication of the resistor 12, capacitor 14, and transistors 20,22. The desired minimum delay during which PUPRST is asserted, necessary in order to assure that all circuits on the chip have reached stable operating voltages, can therefore be compromised due to variations in the chip fabrication process. This means that the power-up reset circuitry 10 must be nominally designed for a long delay, or the chip may not power up in a known state. Selection of an inverter trip point which is too high or an RC time constant which is too long may extend the reset cycle so far that a system tries to access the chip before reset is complete.

It would therefore be desirable to provide a power-up reset circuit which reliably delays the reset signal until the supply voltage is high enough to ensure stable operation of the chip circuitry. It would further be desirable to provide such a circuit which operates properly even when process variations impact the operating parameters of chip circuitry.

SUMMARY OF THE INVENTION

It is therefore an object of the present invention to provide a circuit for generating a signal usable for chip-wide reset upon application of power to the chip.

It is a further object of the present invention to provide such a circuit which ensures a reliable delay during which a reset signal is asserted.

It is another object of the present invention to provide such a circuit which accommodates process variations without impacting its performance.

It is yet another object of the present invention to provide such a circuit which is usable in CMOS integrated circuits.

Therefore, according to the present invention, a circuit for generating a reset signal on chip power-up includes two field effect devices connected between a power supply voltage and the input to an inverter. A capacitor is connected between the inverter input and the low supply voltage. Current flows through the field effect devices to charge the transistor only when the supply voltages are greater than the sum of the absolute values of their threshold voltages. The output of the inverter is used as the chip power-up reset signal.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
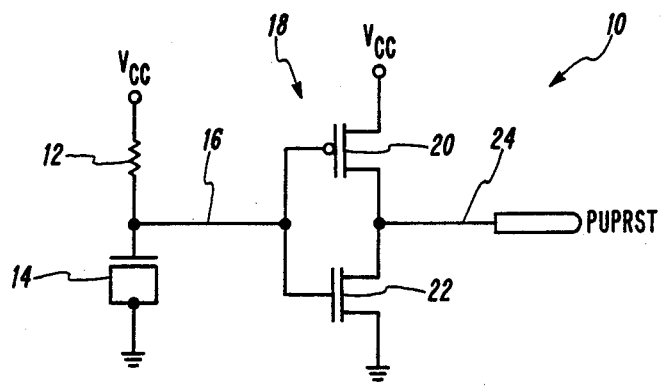
FIG. 1 is a schematic diagram of a prior art circuit for generating a power-up reset signal on an integrated circuit chip.
Figure 2:
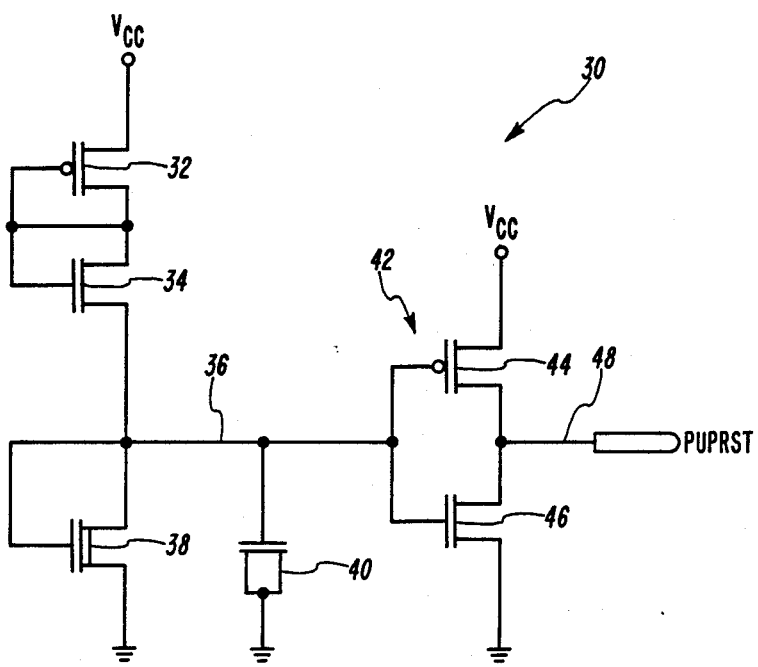
FIG. 2 is a schematic diagram of a power-up reset circuit according to the present invention.

Referring to FIG. 2, a power-up reset circuit 30 provides improved operation for generating a power-up reset signal (PUPRST) on a CMOS integrated circuit chip. P-channel transistor 32 and N-channel transistor 34 are connected in series to $V_{cc}$ to provide a load in the well-known diode configuration. The source of transistor 34 is connected to a node 36. Connected between the node 36 and ground are a depletion-mode N-channel transistor 38 and a capacitor 40. The capacitor 40 is preferably a depletion transistor with its source and drain tied to ground as is known in the art.

Node 36 is also connected to the input of an inverter 42, which consists of P-channel transistor 44 and N-channel transistor 46. Output node 48 of the inverter 42 provides the reset signal PUPRST.

Once $V_{cc}$ rises above $|V_{TP}|$ (threshold voltage of P-channel transistor 44), the output signal PUPRST begins to track $V_{cc}$. While $V_{cc}$ is less than $|V_{TN}|$ (threshold voltage of N-channel transistor 46)+$|V_{TP}|$, transistor 34 is off and current does not flow from $V_{cc}$ to node 36.

Depletion mode transistor 38 shunts to ground any subthreshold leakage through transistors 32 and 34. Also, any noise transients which might be coupled onto the node 36 are also shunted to ground. The gate of depletion-mode transistor 38 can be connected to ground, instead of to node 36 as shown in FIG. 2.

Once $V_{cc}$ rises above the value $|V_{TP}|+|V_{TN}|$, both transistors 32 and 34 begin to conduct and to charge capacitor 40. Once the voltage on node 36 reaches the trip point of the inverter 42, PUPRST goes low and the power-up reset cycle is completed. Due to an RC time constant created by the capacitor 40 and the ON resistance of load transistors 32 and 34, the voltage at node 36 will lag the increasing value of $V_{cc}$ by small amount.

Load transistors 32 and 34 act to prevent charging of capacitor 40 until after $V_{cc}$ has risen above $|V_{TN}|+|V_{TP}|$. The inverter 42 will not change state until $V_{cc}$ has risen to a level at least these two threshold voltages higher than the trip point of the inverter 42. With, for example, typical values of both threshold voltages of approximately 1 volt, and a trip point for the inverter of approximately 1.5 volts, inverter 42 will not end the power-up reset cycle until $V_{cc}$ has reached a value of at least 3.5 volts. When $V_{cc}$ is this high, the remainder of the on chip circuitry is guaranteed to be operating properly.

When power is removed, capacitor 40 will discharge through depletion transistor 38 and will be prepared for the next power-up cycle. If depletion mode devices are not available in a particular process flow, it is possible to replace depletion transistor 38 with a small N-channel transistor having its gate tied to $V_{cc}$. This alternative transistor should be sized so that its ON resistance is less than that of transistors 32 and 34, so that capacitor 40 is charged from, $V_{cc}$ faster than it is discharged through such transistor. It is also possible to eliminate transistor 38 entirely, and rely on leakage currents to discharge the capacitor 40.

It will be appreciated by those skilled in the art that the circuit described in FIG. 2 is relatively insensitive to process variations. If threshold voltages are different from those called for by design, load transistors 32 and 34 will be affected as well as logic circuitry transistors such as 44 and 46. Higher threshold voltages require $V_{cc}$ to be higher to ensure proper circuit operation, but also cause transistors 32 and 34 to delay the point at which capacitor 40 begins charging. Smaller threshold voltages decrease the value of $V_{cc}$ at which transistors 32 and 34 begin to conduct, but also mean that the remainder of the circuitry on chip will perform properly at slightly lower $V_{cc}$ values.

The circuit shown in FIG. 2 has been described in connection with a CMOS design, but can also be used in standard NMOS circuitry. In such a design, transistor 44 is a depletion mode transistor with its gate tied to node 48, and transistor 32 can be simply another N-channel transistor with its gate tied to $V_{cc}$ if desired. The remainder of the circuitry remains the same as shown in FIG. 2.

While the invention has been particularly shown and described with reference to a preferred embodiment, it will be understood by those skilled in the art that various changes in form and detail may be made therein without departing from the spirit and scope of the invention.

What is claimed is:

1. A circuit for generating a power-up reset signal on an integrated circuit chip, comprising:
   an inverter having an input and an output;
   a capacitor connected between a power supply ground and the inverter input;
   a load connected to a power supply voltage and to the inverter input for conducting current only when the power supply voltage rises above a preselected value, whereby said capacitor is charged only when the power supply voltage is greater than the preselected value; and
   means including a transistor connected to the inverter input for holding a voltage across said capacitor to power supply ground until said load begins to conduct;
   wherein the power-up reset signal is generated by the inverter output.

2. The circuit of claim 1, wherein said holding means comprises a depletion-mode transistor having a drain connected to the inverter input and a source a gate connected to the power supply ground.

3. The circuit of claim 1, wherein said load comprises:
   two field effect transistors connected in series between the power supply voltage and the inverter input, wherein the gates of said series transistors are connected so as to form diodes.

4. The circuit of claim 3, wherein the gates of said series transistors are connected to the drains thereof, respectively.

5. The circuit of claim 1, wherein said inverter is a CMOS inverter having an N-channel and a P-channel field effect transistor.

6. The circuit of claim 5, wherein said load comprises:
   a P-channel load transistor connected to the power supply voltage; and
   an N-channel load transistor connected to said P-channel load transistor and to the inverter input, wherein the gates of both load transistors are connected to a common node between said load transistors.

* * * * *